United States Patent [19]
Yiu et al.

[11] Patent Number: 6,166,956
[45] Date of Patent: *Dec. 26, 2000

[54] FAST FLASH EPROM PROGRAMMING AND PRE-PROGRAMMING CIRCUIT DESIGN

[75] Inventors: Tom Dang-Hsing Yiu; Ray L. Wan, both of Milpitas, Calif.; Ling-Wen Hsiao, Taipei, China; Tien-Ler Lin, Cupertino, Calif.; Fuchia Shone, Hsinchu, China

[73] Assignee: Macronix International Co., Ltd., Hsinchu, Taiwan

[*] Notice: This patent is subject to a terminal disclaimer.

[21] Appl. No.: 09/303,153

[22] Filed: Apr. 30, 1999

Related U.S. Application Data

[62] Division of application No. 09/106,525, Jun. 29, 1998, Pat. No. 5,956,273, which is a continuation of application No. 08/700,587, Aug. 14, 1996, Pat. No. 5,821,909, which is a continuation of application No. 08/444,315, May 18, 1995, Pat. No. 5,563,822, which is a division of application No. 08/393,243, Feb. 23, 1995, Pat. No. 5,563,823, which is a continuation of application No. 08/108,671, Aug. 31, 1993, abandoned.

[51] Int. Cl.[7] .................................................. G11C 7/00
[52] U.S. Cl. ............................. 365/185.19; 365/185.14
[58] Field of Search ..................... 365/185.09, 185.14, 365/185.19, 185.22, 185.26

[56] References Cited

U.S. PATENT DOCUMENTS

| | | | |
|---|---|---|---|
| 4,222,062 | 9/1980 | Trotter et al. | 365/185.18 X |
| 4,460,982 | 7/1984 | Gee et al. | 365/189 |
| 4,617,652 | 10/1986 | Sirko | 365/185.26 X |
| 4,996,571 | 2/1991 | Kume et al. | 357/23.5 |
| 5,043,940 | 8/1991 | Harari | 365/185.03 |
| 5,050,125 | 9/1991 | Momodomi et al. | 365/189.11 X |
| 5,053,990 | 10/1991 | Kreifels et al. | 364/900 |
| 5,132,935 | 7/1992 | Ashmore, Jr. | 365/185 |
| 5,163,021 | 11/1992 | Mehrotra et al. | 365/185 |

(List continued on next page.)

FOREIGN PATENT DOCUMENTS

| | | |
|---|---|---|
| 89101447 | 1/1989 | European Pat. Off. . |
| 91300610 | 1/1991 | European Pat. Off. . |
| 91830154 | 4/1991 | European Pat. Off. . |
| 62-274781 | 11/1987 | Japan . |
| 2037597 | 2/1990 | Japan . |
| 2210694 | 9/1990 | Japan . |
| 3276674 | 12/1991 | Japan . |
| WO94/28554 | 12/1994 | WIPO . |

OTHER PUBLICATIONS

Advanced Micro Devices AM28F020 262, 144X8–bit CMOS Flash Memory, Publications 14727, Rev. B, Issued Mar. 1991 4–101–4–140.

*Primary Examiner*—A Zarabian
*Attorney, Agent, or Firm*—Mark A. Haynes; Haynes & Beffel

[57] ABSTRACT

A circuit for speeding up the pre-programming of floating gate storage transistors such as FLASH EPROMS, and particularly speeding up the pre-programming of a block or array of floating gate storage transistors includes a controllable voltage source that supplies gate programming potential across the control gate and source of the FLASH EPROM transistor cells to be programmed. A control circuit is provided that controls the voltage source to vary the gate programming potential during a programming interval as a function of time in order to decrease the time required for a given amount of charge movement to program the selected floating gate transistors. The wordline voltages are varied, while the source voltage is held constant. By starting at a lower wordline voltage, and increasing during the programming interval to a high wordline voltage, the programming speed is increased, and the high final turn-on threshold voltage for the programmed floating gate storage transistors is achieved. In addition, in order to speed up pre-programming, a programming potential is applied to four wordlines in parallel during a single programming interval. Further, the load on cells being programmed is adjusted to improve programming speed.

14 Claims, 10 Drawing Sheets

U.S. PATENT DOCUMENTS

| | | | |
|---|---|---|---|
| 5,200,920 | 4/1993 | Norman et al. | 365/185 |
| 5,257,225 | 10/1993 | Lee | 365/185 |
| 5,297,096 | 3/1994 | Terada et al. | 365/185 X |
| 5,386,388 | 1/1995 | Atwood et al. | 365/185.26 X |
| 5,399,891 | 3/1995 | Yiu et al. | 365/185.16 |
| 5,418,742 | 5/1995 | Asano | 365/185 |
| 5,428,578 | 6/1995 | Kaya et al. | 365/185.29 X |
| 5,463,586 | 10/1995 | Chao et al. | 365/185.21 X |
| 5,487,033 | 1/1996 | Keeney et al. | 365/185.19 |
| 5,528,546 | 6/1996 | Chao et al. | 365/185.21 |
| 5,539,688 | 7/1996 | Yiu et al. | 365/185.16 X |
| 5,544,117 | 8/1996 | Nakayama et al. | 365/185.22 |
| 5,553,020 | 9/1996 | Keeney et al. | 365/185.19 |
| 5,563,822 | 10/1996 | Yiu et al. | 365/185.14 |
| 5,563,823 | 10/1996 | Yiu et al. | 365/185.16 |
| 5,615,153 | 3/1997 | Yiu et al. | 365/185.19 |
| 5,821,909 | 10/1998 | Yiu et al. | 365/185.14 |

FAST FLASH EPROM PROGRAMMING AND PRE-PROGRAMMING CIRCUIT DESIGN

The present application is a division of parent application Ser. No. 09/106,525 filed Jun. 29, 1998, now U.S. Pat. No. 5,956,273, which is a continuation of 08/700,587 filed Aug. 14, 1996, now U.S. Pat. No. 5,821,909, which is a continuation of 08/444,315 filed May 18, 1995, now U.S. Pat. No. 5,563,822, which is a division of 08/393,243 filed Feb. 23, 1995, now U.S. Pat. No. 5,563,823, which is a continuation of 08/108,671 filed Aug. 31, 1993, now abandoned.

BACKGROUND OF THE INVENTION

1. Field of the Invention

The present invention relates to the design of erasable and programmable non-volatile memory integrated circuits; and more particularly to circuits for programming and pre-programming memory cells in the device, suited for FLASH EPROM or EEPROM memory cells.

2. Description of Related Art

Non-volatile memory design based on integrated circuit technology represents an expanding field. One popular class of non-volatile memory cell is known as electrically erasable-programmable read only memory (EEPROM), which includes standard EEPROM and FLASH EPROM designs.

Both the FLASH EPROM and EEPROM technologies are based on a memory transistor which consists of a source, channel, and drain with a floating gate over the channel and a control gate isolated from the floating gate. The act of programming the cell involves charging the floating gate with electrons, which causes the turn on threshold of the memory cell to increase. FLASH EPROM typically uses a hot electron programming technique to charge the cells. When programmed the cell will not turn on, that is it will remain non-conductive, when addressed with a read potential applied to its control gate. The act of erasing the cell involves removing electrons from the floating gate to lower the threshold. With the lower threshold, the cell will turn on to a conductive state when addressed with a read potential to the control gate.

The programming and erasing modes for FLASH EPROMS according to the prior art are described in U.S. Pat. No. 5,053,990, invented by Kreifels, et al. See also, U.S. Pat. No. 4,875,118, entitled VOLTAGE MARGINING CIRCUIT FOR FLASH EPROM, invented by Jungroth; and Am28F020, 262,144×8 Bit CMOS Flash Memory, Advance Information, Advanced Micro Devices, Inc., March 1991.

In addition, the prior art techniques for erasing floating gate memory cells involve erasing the entire memory array in one operation.

In order to erase a cell, and insure that the right amount of charge is removed from the entire block being erased, all cells in the chip are pre-programmed to a known state (00 hex). This way, when the chip is erased, all of the memory cells will start with substantially the same amount of charge in the floating gate. However, the pre-programming stage in a chip erase operation takes a substantial amount of time. Each byte in the block to be erased must be programmed, and then the success of programming verified. Only after the entire chip has been pre-programmed and verified, can the erase operation occur.

Thus, it is desirable to provide a fast programming and pre-programming technique for floating gate memory devices, such as FLASH EPROMs.

SUMMARY OF THE INVENTION

The present invention provides a circuit for speeding up the programming of floating gate storage transistors, and particularly speeding up the programming of a block or array of floating gate storage transistors.

The circuit includes a controllable voltage source that supplies a gate programming potential across the control gate and drain of the floating gate transistors to be programmed which causes charge to move into the floating gate. In addition, a control circuit is provided that controls the voltage source to vary the gate programming potential during a programming interval as a function of time in order to decrease the time required for a given amount of charge movement to program the selected floating gate transistors. In the preferred system, the wordline voltages are varied, while the drain voltage is held constant. By starting at a lower wordline voltage, and increasing during the programming interval to a higher wordline voltage, the programming speed is increased, and a high final turn-on threshold voltage for the programmed floating gate storage transistors is achieved.

In addition, in order to speed up pre-programming or programming of a sector of memory cells, in a preferred system, a programming potential is applied to one byte on each of four wordlines (4×wordlines) or four bytes on a single wordline (4×bitlines) in parallel during a single programming interval. This results in four times the speed for sector programming (such as used in preprogramming) of the prior art.

The control circuit can control the voltage source so that the gate programming potential increases from a beginning potential to an ending potential during programming. The waveform generated in a preferred system may be a three-level step starting at a first programming potential, stepping up during the programming interval to a second potential, and finally stepping up during the programming interval to a third programming potential. Alternatively, a two-level step may be implemented, or a more continuously increasing algorithm may be applied as suits the needs of a particular implementation.

According to yet another aspect of the present invention, programming speed can be increased by controlling the load resistance on the bitlines during a programming interval. In particular, the programming circuit according to the present invention may include circuitry that reduces the load resistance of selected bitlines during programming. This has the effect of increasing the slope of the load line on the cells to be programmed, thereby increasing the efficiency of the charge injection operation.

According to yet another aspect of the present invention, the programming circuitry is applied to a segmentable FLASH EPROM circuit, which supports block and chip erase operations.

In sum, better programming performance is achieved using a stepped or increasing programming potential during the programming of FLASH EPROM integrated circuits. Further, by increasing the program potential with stepped wordline voltage, over-erased cells are more likely to be successfully programmed. In addition, during pre-programming, particularly in segmented architectures in which the load resistance on a particular cell during programming may be relatively high, the technique of programming multiple cells in parallel further improves performance of the integrated circuit. Further, adjusting the load lines on cells during programming provides better programming speeds.

Other aspects and advantages of the present invention can be seen upon review of the figures, the detailed description, and the claims which follow.

DETAILED DESCRIPTION

Figure 1:
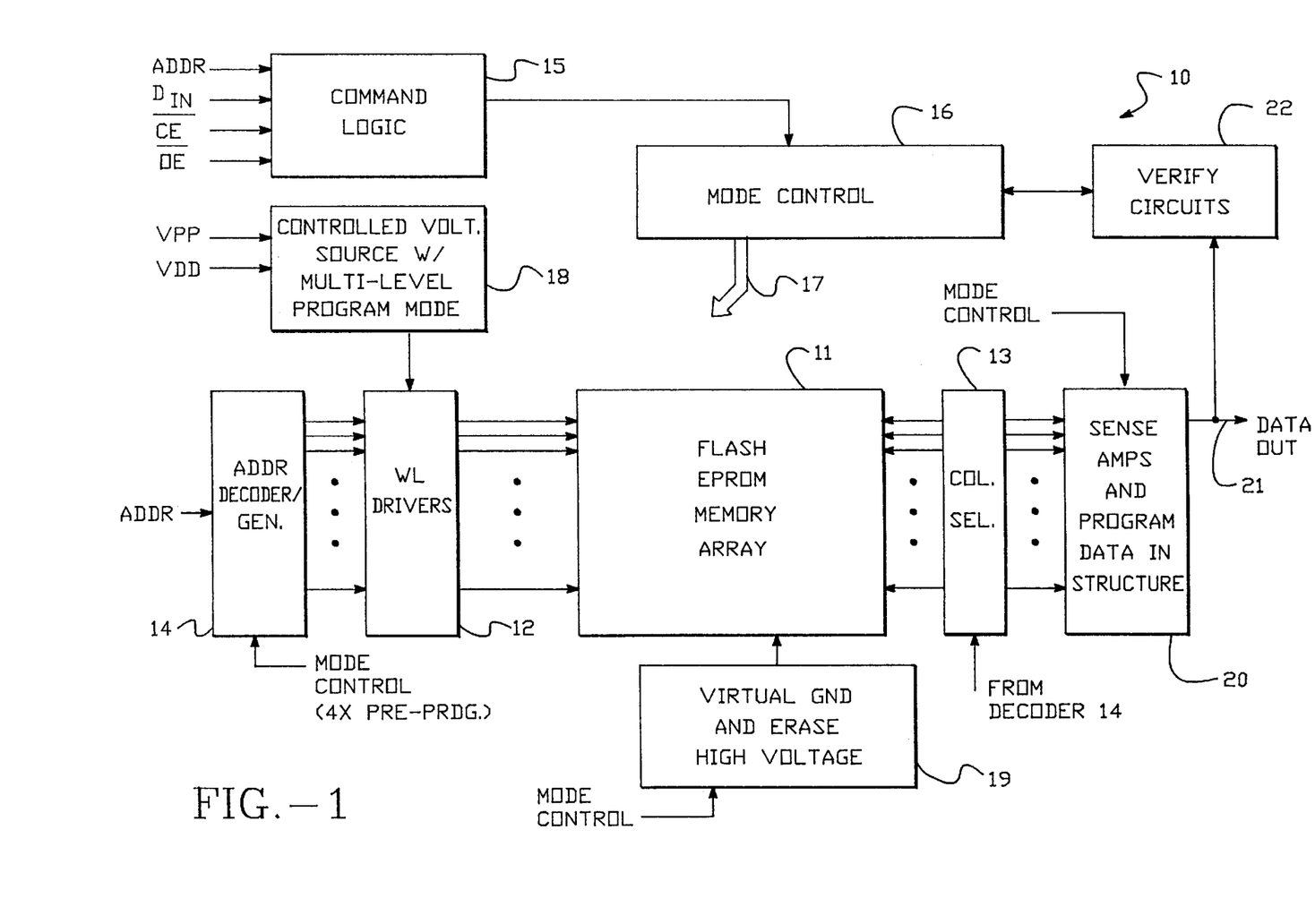
FIG. 1 is a schematic block diagram of a FLASH EPROM integrated circuit according to the present invention.
Figure 2:
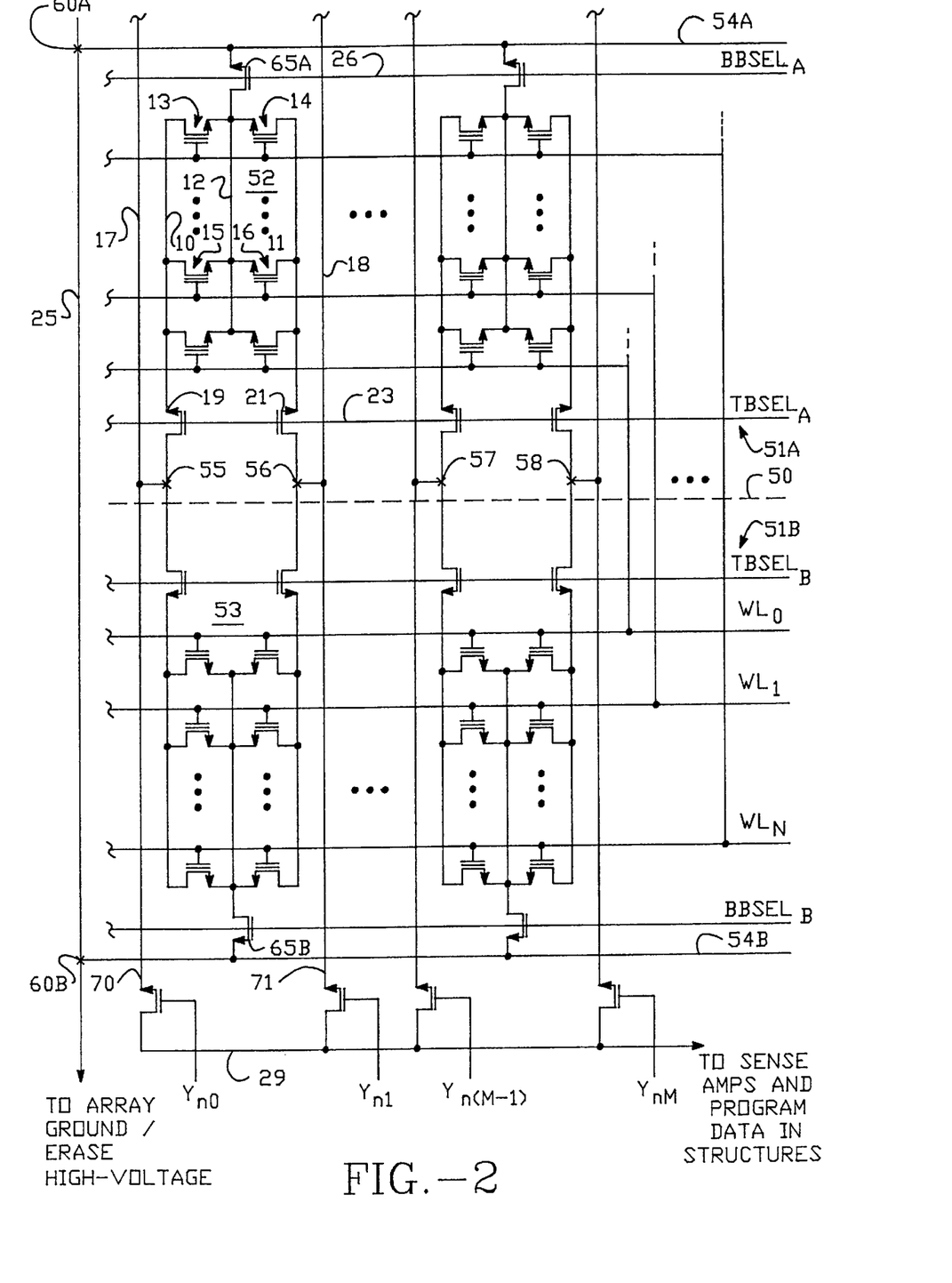
FIG. 2 is a schematic diagram of a segmentable architecture FLASH EPROM array according to the present invention.
Figure 3:
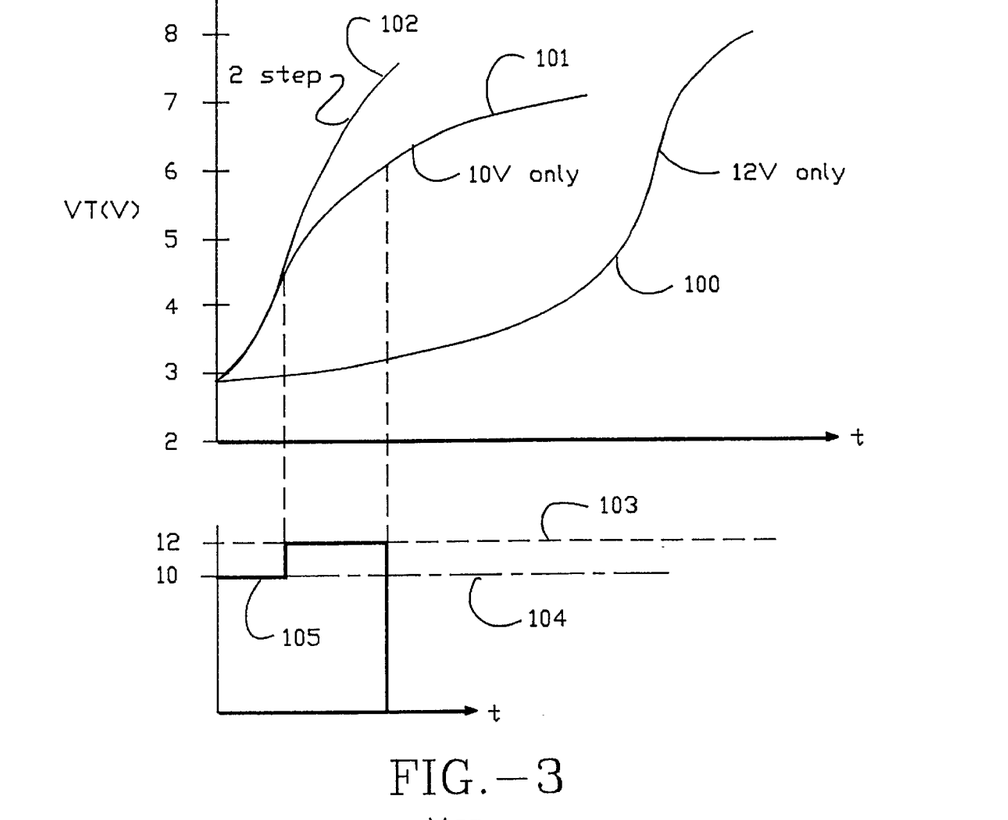
FIG. 3 is a graph illustrating the programming speed and programming potential for floating gate storage cells according to the present invention.
Figure 4:
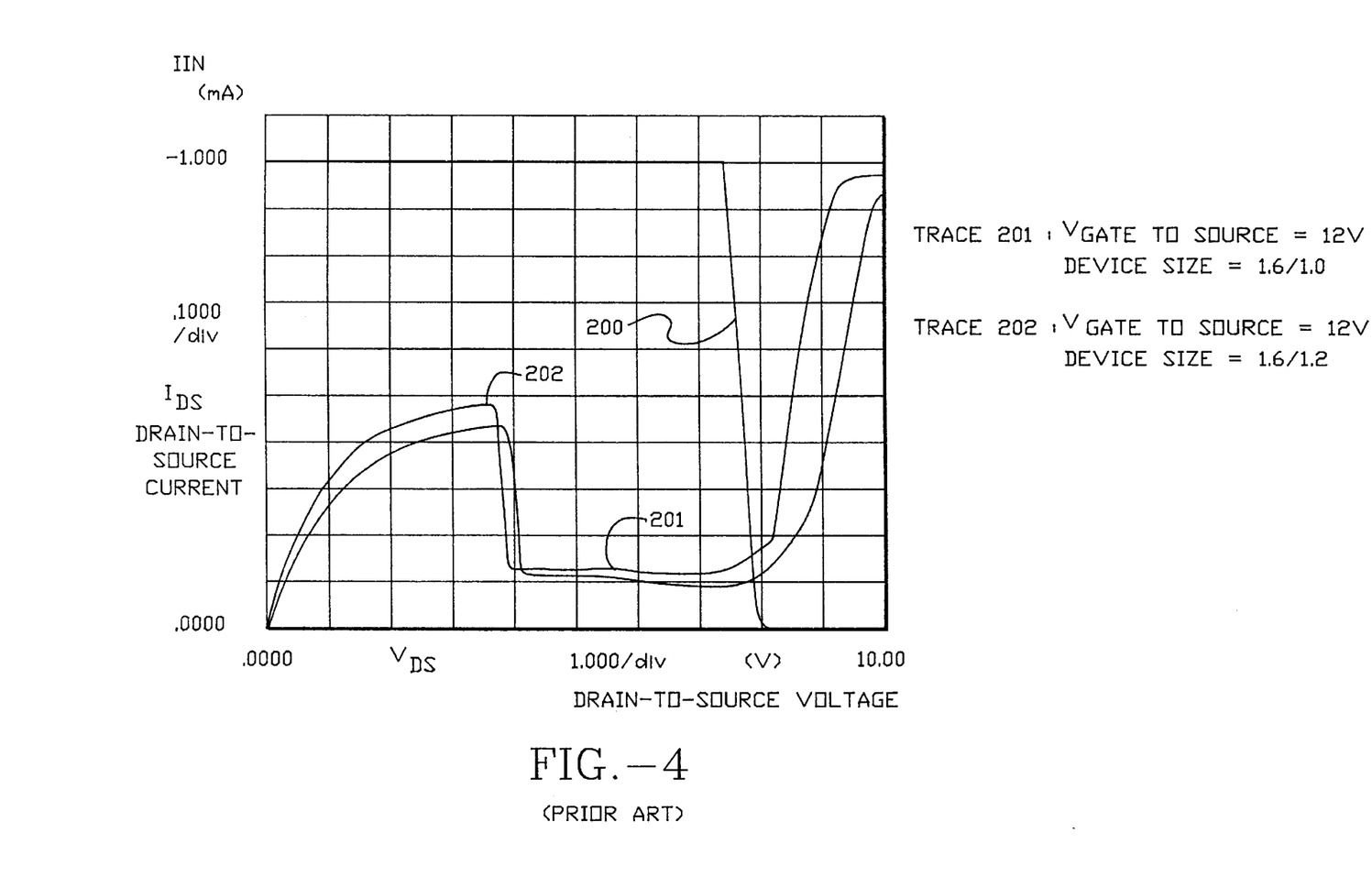
FIG. 4 is a plot of one shot curves for prior art FLASH EEPROM cell with the programming potential of 12 volts.
Figure 5:
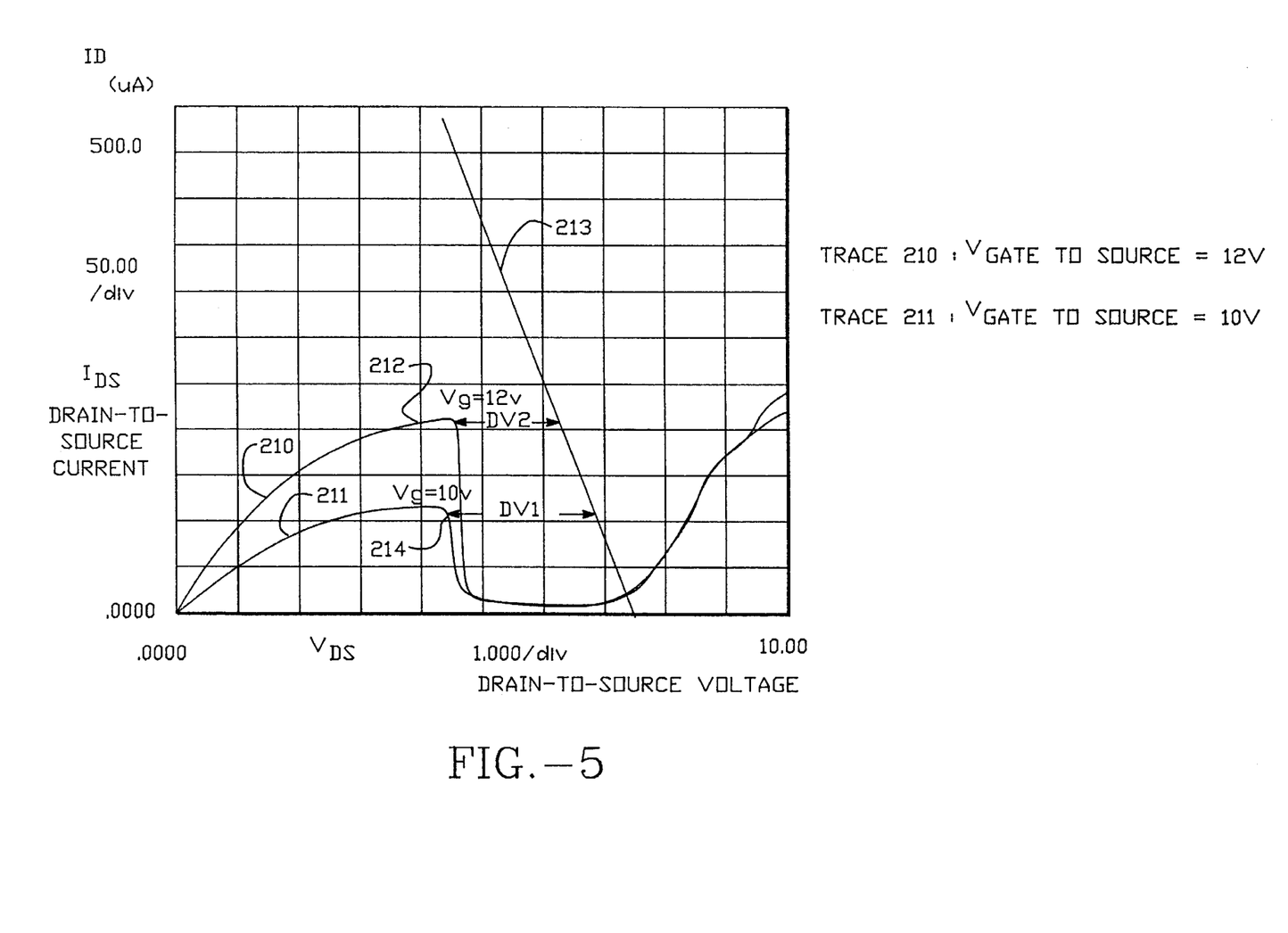
FIG. 5 is a plot of one shot curves for the contactless virtual ground FLASH EPROM cell used in the array of FIG. 2, with a programming potential of 12 volts and a programming potential of 10 volts.
Figure 6:
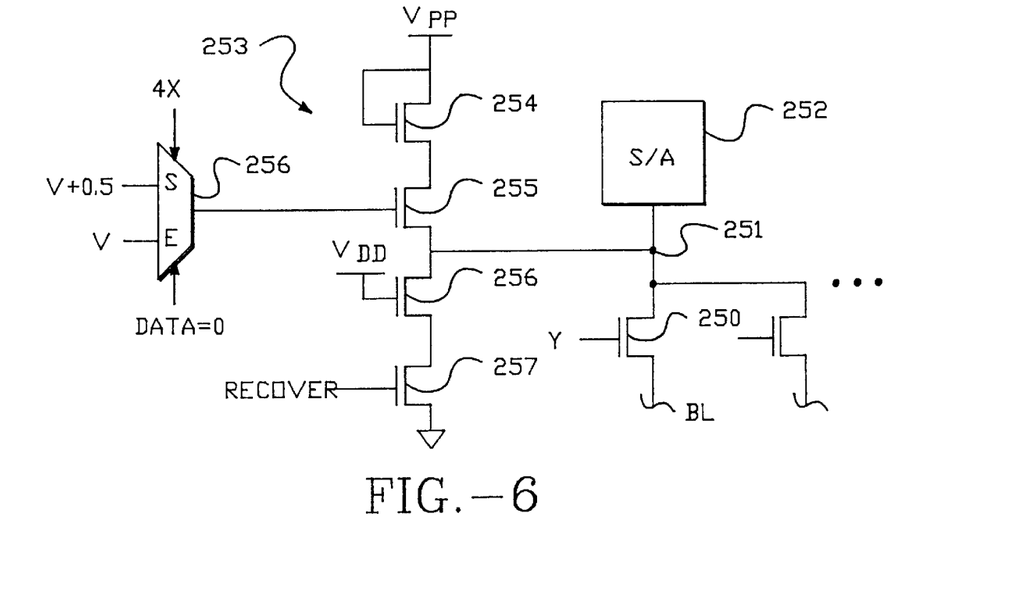
FIG. 6 is a schematic diagram of a circuit for controlling the load on the bitlines in the array of FIG. 2 during pre-programming.
Figure 7:
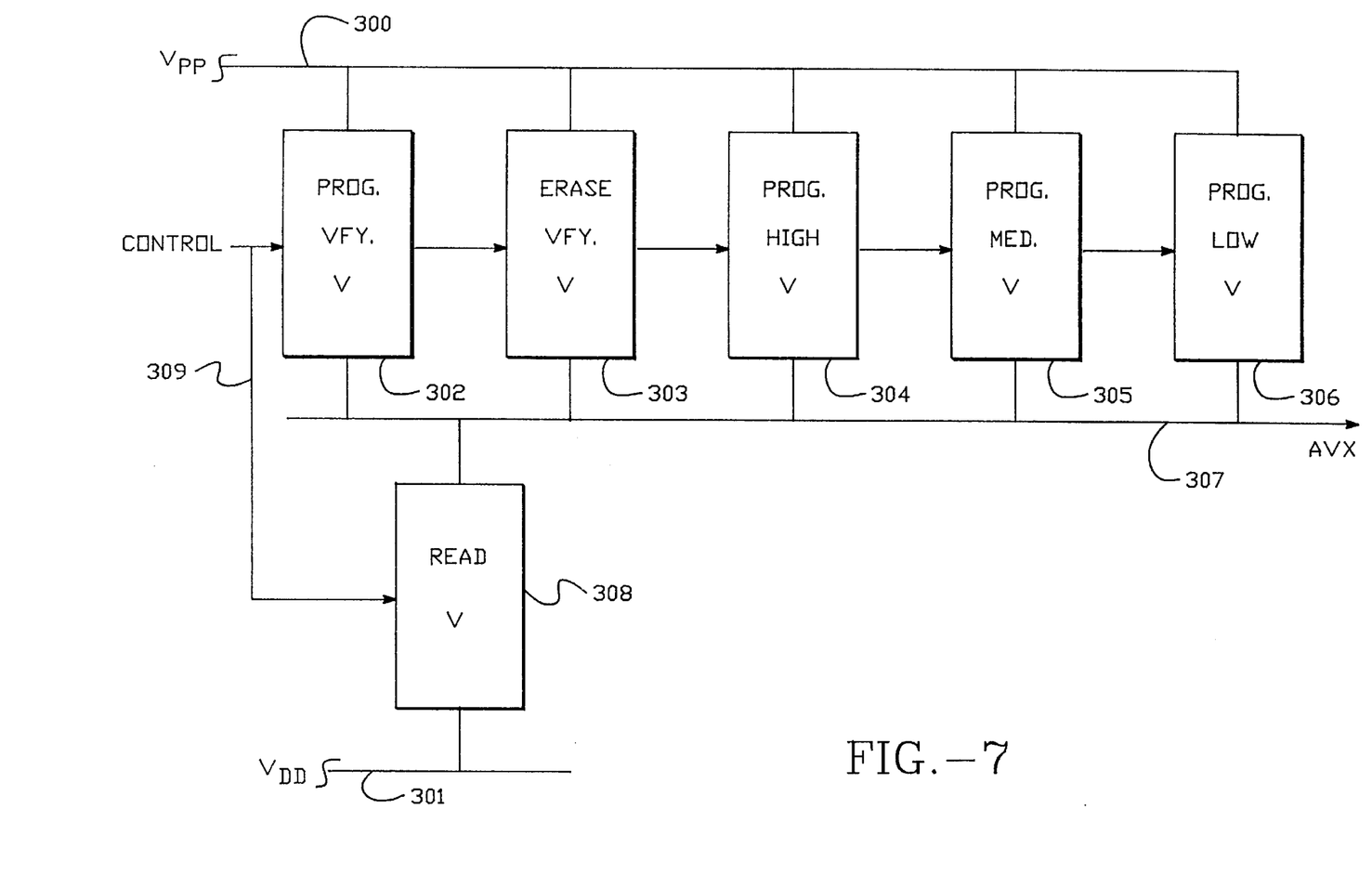
FIG. 7, is a schematic diagram of a controllable voltage source for use in the circuit of FIG. 1.
Figure 8:
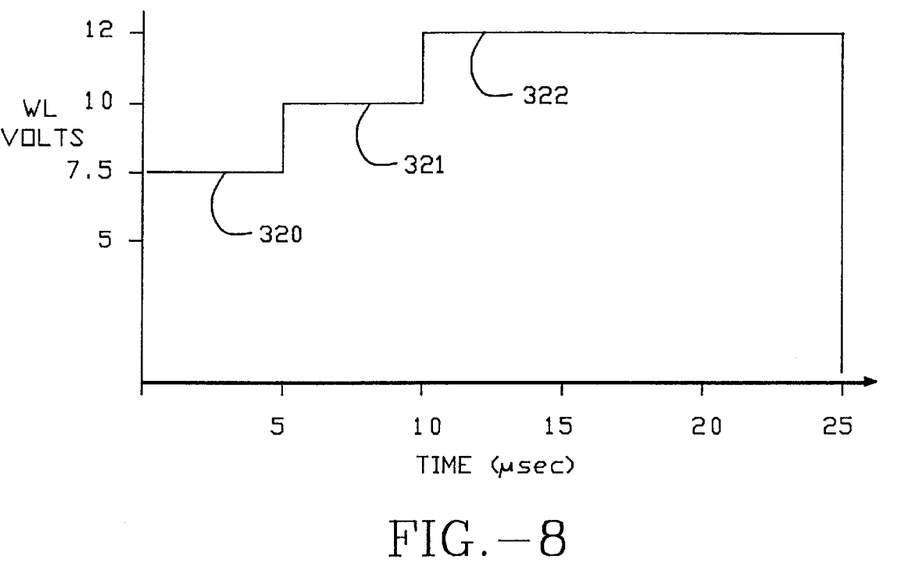
FIG. 8 illustrates the programming potential as a function of time during the programming interval according to a preferred embodiment of the present invention.
Figure 9:
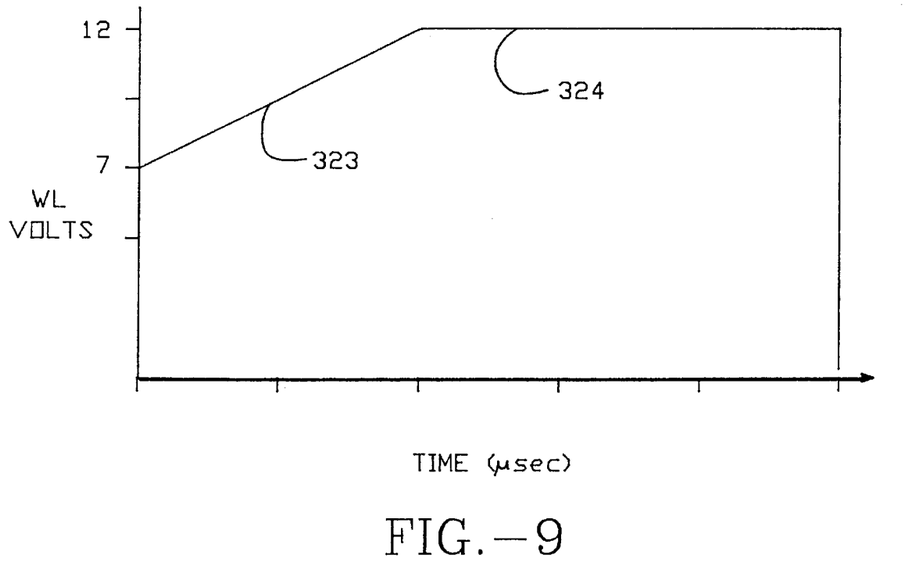
FIG. 9 illustrates an alternative, more continuous programming potential as a function of time according to the present invention.
Figure 10A:
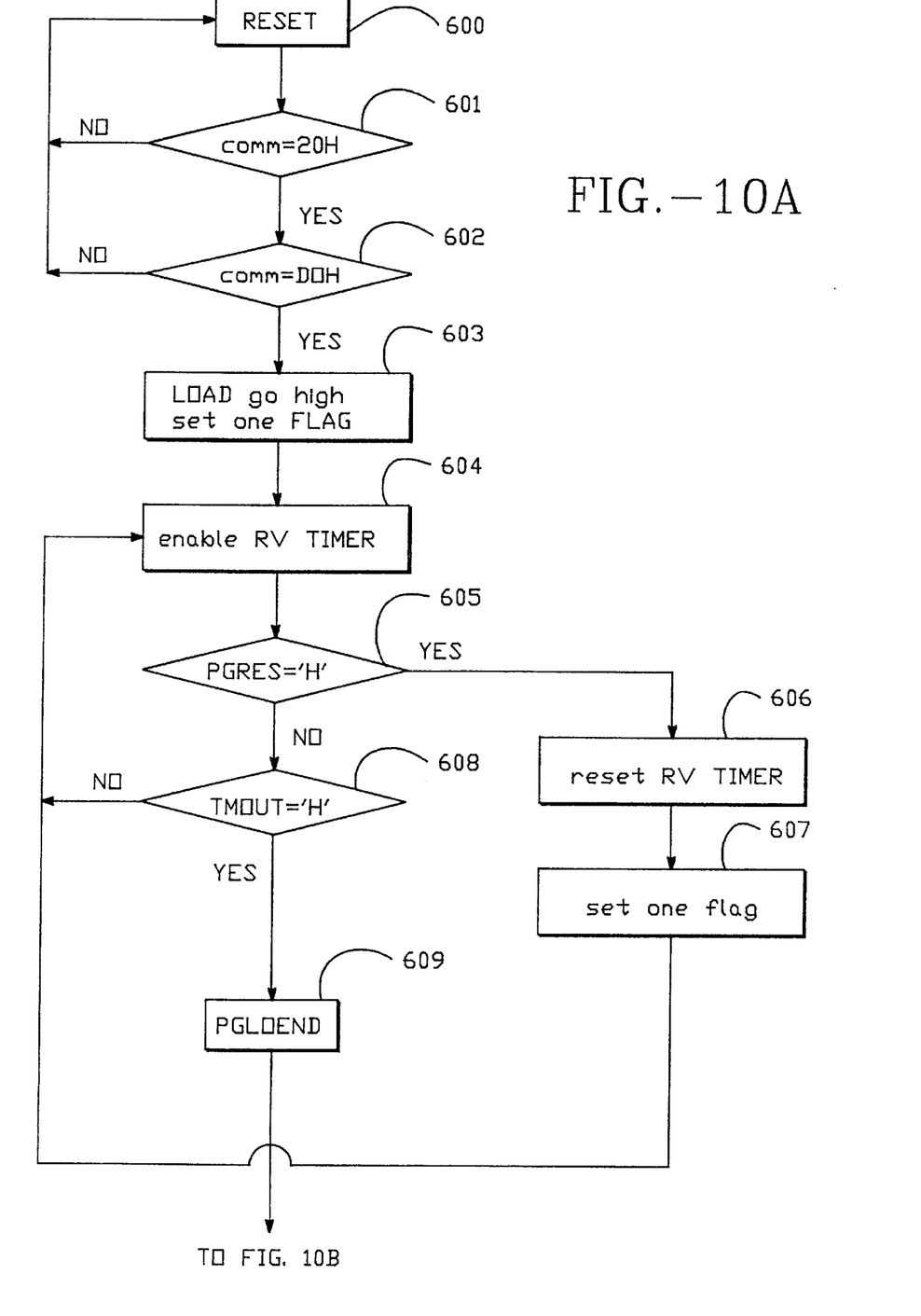
FIGS. 10A–10C are flowcharts illustrating an embedded erase operation with pre-programming according to the present invention.
Figure 10B:
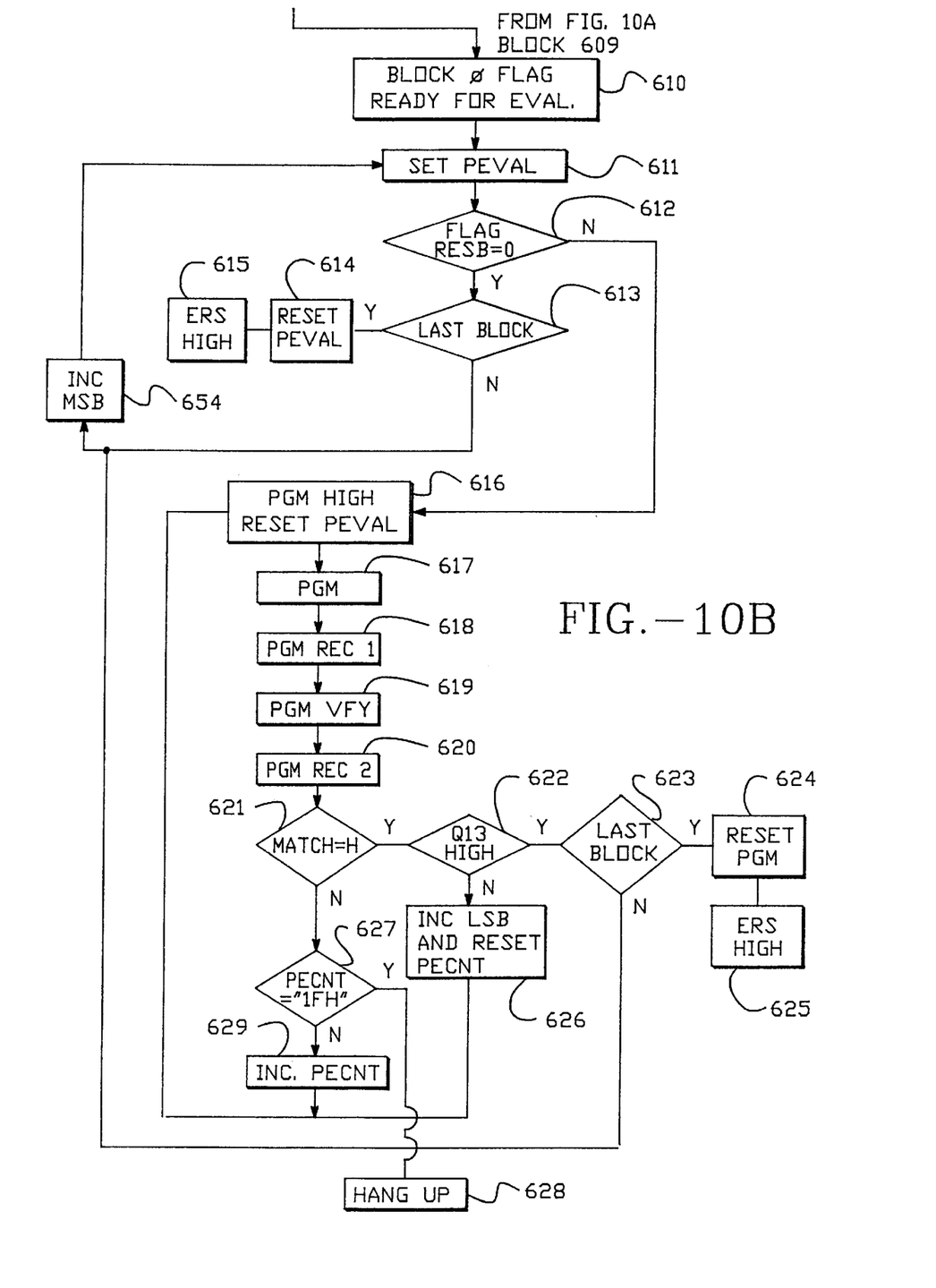
Figure 10C:
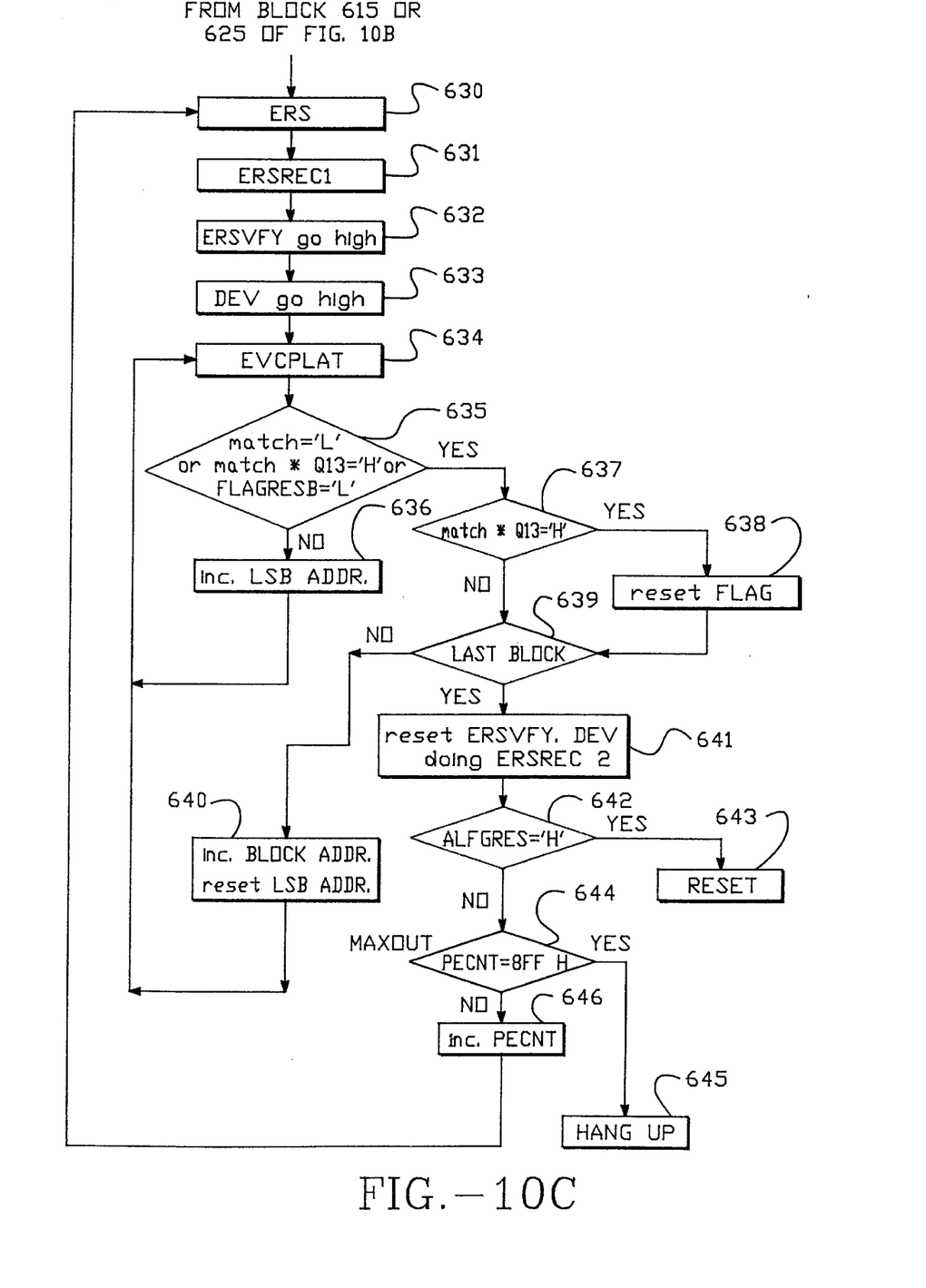

A detailed description of preferred embodiments of the present invention is provided with reference to the figures. FIG. 1 provides a functional overview of an integrated circuit according to the present invention. FIGS. 2 and 3 provide details concerning implementation of a segmented FLASH EPROM array according to the present invention. FIGS. 3–5 are plots used to describe the operation of the present invention. FIGS. 6 and 7 illustrate circuits for increasing the programming and pre-programming speed of the FLASH EPROM circuit according to the present invention. FIGS. 8 and 9 illustrate alternative programming potential waveforms. FIGS. 10A–10C illustrate an embedded block level erase routine with improved pre-programming speed for a FLASH EPROM.

System Overview (FIGS. 1 and 2)

As shown in FIG. 1, an integrated circuit, generally 10, is provided that includes a FLASH EPROM memory array 11. The FLASH EPROM memory array 11 is addressed using wordline drivers 12, and column select circuits 13. An address decoder/generator 14 is used to control the wordline drivers, and the column select circuit 13.

A FLASH EPROM memory array, as known in the art, includes a plurality of modes, including a read mode, a program mode, a program verify mode, an erase mode, including a program and verify phase and an erase verify mode. Thus, command logic 15 is provided by which the mode of the integrated circuit is controlled in response to user inputs.

The command logic 15 may be implemented as done in standard FLASH EPROM integrated circuits, such as the Am28F020 flash memory chip manufactured by Advanced Micro Devices, Inc., of Sunnyvale, Calif., with such additional commands as used in the block erase mode described below. In response to commands issued by the command logic 15, a mode control circuit 16 generates mode control signals which are distributed as indicated by arrows 17 throughout the chip to control an embedded erase operation.

To support the modes of operation of the integrated circuit, a controlled voltage source 18, that includes a multi-level program mode is included. This controlled voltage source is coupled to the wordline drivers 12 to control the voltage applied to the control gate of cells in the memory array 11. Also, a virtual ground and erase high voltage circuit 19 is coupled to the array 11, and controlled in response to the mode control signals. Finally, sense amps and program data in structures 20 are coupled to the output of the column select circuits 13. The sense amps supply data out on line 21. Also, data on line 21 are supplied to verify circuits 22 which are used in the erase and program verify modes. The verify circuits 22 are coupled to the mode control circuit 16 as shown. The sense amps and program data in structures 20 are also responsive to the mode control, as described below. In particular, during pre-programming, or programming, the load of the bitlines is adjusted to increase the programming speed.

The address decoder/generator 14 is also responsive to mode control signals. During pre-programming and erasing, the address generator is enabled to generate the addressing sequences for block and chip erase functions. Also, during pre-programming, the address generator is enabled to pre-program four cells in parallel by, for example, energizing four wordlines during a single programming interval. To accomplish this, the two least significant bits of the wordline address at the output of the generator are masked, and all four wordlines are driven in parallel.

The FLASH EPROM memory array 11 according to the present invention has a segmentable array architecture, which allows for block and chip erase operations.

FIG. 2 illustrates the preferred segmentable array architecture according to the present invention having a virtual ground cell structure. The array uses a drain-source-drain configuration for the FLASH EPROM circuit, as described in co-pending U.S. patent application Ser. No. 07/823,882, filed Jan. 22, 1992, entitled NON-VOLATILE MEMORY CELL AND ARRAY ARCHITECTURE, owned now and at the time of both inventions by the same Assignee as the present application, and incorporated herein by reference for information about the state of the art.

The circuit includes a first local bitline 10 and a second local bitline 11. The first and second local bitlines 10, 11 are implemented by buried diffusion conductors. Also included is a local virtual ground line 12 implemented by buried diffusion. A plurality of floating gate transistors having gates, drains and sources are coupled to the local bitlines 10, 11 and local virtual ground line 12. The sources of the plurality transistors are coupled to the local virtual ground line 12. The drains of a first column of transistors, generally 13, are coupled to the first local bitline 10, and the drains of a second column of transistors., generally 14, are coupled to the second local bitline 11. The gates of the floating gate transistors are coupled to wordlines $WL_0$ through $WL_N$, where each wordline (e.g., $W_1$) is coupled to the gate of a transistor (e.g., transistor 15) on the first local bitline 10 and a transistor (e.g., transistor 16) on the second local bitline 11. Thus, transistors 15 and 16 share a source diffusion region.

The act of charging the floating gate is called the program step for the FLASH EPROM cell. This is accomplished through hot electron injection by establishing a large positive voltage between the gate and the source and a positive voltage between the drain and the source, such as six volts.

The act of discharging the floating gate is called the erase step for the FLASH EPROM cell. This is accomplished through F-N (Fowler-Nordheim) tunneling mechanism between the floating gate and the source (drain erase) or between the floating gate and the substrate (channel erase). The source erasing is performed by applying a positive bias to the source, such as twelve volts or seven volts, while the gate is grounded or negatively biased, such as minus seven volts. The channel erasing is performed by applying a negative bias to the gate and/or a positive bias to the substrate.

A first global bitline 17 and a second global bitline 18 are associated with each drain-source-drain block. The first global bitline 17 is coupled to the source of top block select transistor 19 through a metal-to-diffusion contact 55. Similarly, the second global bitline 18 is coupled to the drain of top block select transistor 21 through a metal-to-diffusion contact 56. The sources of the top block select transistors 19, 21 are coupled to the first and second local bitlines 10 and 11, respectively. The gates of the top block selector transistors 19, 21 are controlled by a top block select signal $TBSEL_A$ on line 23.

The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. The gate of the bottom block select transistor 65A is controlled by a bottom block select signal $BBSEL_A$ across line 26. In the preferred system, the conductor 54A is a buried diffusion conductor which extends to a metal-to-diffusion contact 60A at a position displaced horizontally through the array, which provides contact to a vertical metal virtual ground bus 25.

The global bitlines extend vertically through the array to respective column select transistors 70, 71, through which a selected global bitline is coupled to sense amps and program data-in circuitry (not shown). Thus, the source of column select transistor 70 is coupled to global bitline 17, the gate of column select transistor 70 is coupled to a column decode signal $Y_{n0}$, and the drain of the column select transistor 70 is coupled to conductor 29. Conductor 29 is in turn coupled to the sense amps and program data in structure.

The FLASH EPROM array as shown in FIG. 1 is configured into a plurality of subarrays as illustrated in FIG. 2. FIG. 2 illustrates two subarrays within a larger integrated circuit. The subarrays are divided generally along dotted line 50 and include subarray 51A generally above the line 50 and subarray 51B generally below the line 50. A first group 52 of cells is laid out in a mirror image with a second group 53 of cells along a given bitline pair (e.g., bitlines 17, 18). As one proceeds up the bitline pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 25 through metal-to-diffusion contacts 60A, 60B. Thus, the subarray layout requires two metal contact pitches per column of two transistor cells for the global bitlines and one metal contact pitch per subarray for the metal virtual ground line 25.

Furthermore, four subarrays (two are illustrated in FIG. 2) may share wordline signals because of the additional decoding provided by the top and bottom block select signals TBSELA, TBSELB, BBSELA, and BBSELB. During program or erase operations, the program or erase potentials are applied only to blocks selected by the bottom block select transistor.

According to one aspect of the present invention, during pre-programming, or other programming operations in which an entire array or segment of memory cells are to be programmed, the present invention provides for the parallel programming of a plurality of bytes. In a preferred embodiment, the four subarrays which share wordline signals are driven in parallel so that a byte of data in each of the four subarrays is programmed in parallel. Thus, for an 8 bit byte, having one bit stored per subarray, 8 sets of four subarrays are driven in parallel to program 4 bytes in parallel.

In this approach, the signal $BBSEL_A$ for each of the four subarrays is energized to connect each of the four subarrays to the array ground through contact 60B and line 25. This results in the current for programming four bits in parallel to be supplied across a given bitline for each set of four subarrays. The load on the bitline in this case is controlled as described below with respect to FIG. 6.

In an alternative system, four bytes may be programmed in parallel with four bits, one from each of the four bytes being programmed, taken from a single subarray. This is accomplished by energizing a single subarray per column of subarrays using the TBSEL signal. The wordlines are energized as before, but subarrays in which the TBSEL signal is not energized will not conduct current for the programming operation. The four bits in a single subarray are selected using the column select signals $Y_N$ onto a single data line 29. In this alternative embodiment, the column select transistor driven by the signal $Y_N$ will only carry the current for programming a single cell. Thus, the alternative approach may be preferred in some applications of the invention.

As can be seen, the architecture according to the present invention provides a sectored FLASH EPROM array. This is beneficial because the source and drain of transistors in non-selected subarrays during a read, program or erase cycle may be isolated from the currents and voltages on the bitlines and virtual ground lines. Thus, during a read operation, sensing is improved because leakage current from subarrays not selected does not contribute to current on the bitlines. During the program and erase operations, the high voltages of the virtual ground line, and the bitlines, are isolated from the unselected blocks. This allows a sectored erase operation.

From the programmability perspective, the contactless virtual ground cell of FIG. 2 has certain drawbacks as compared to conventional NOR array FLASH EPROM cells. In particular, extra resistance in the buried diffusion local bitlines, and in the top and bottom select transistors adds extra load resistance in the programming path. The top block select transistors 19, 21 are added to allow the sharing of wordlines with neighboring subarrays due to very tight cell layout in the Y direction. Because this transistor has to be squeezed in the X direction of the cell pitch, the transistor width is very small and the equivalent resistance may be as high as 3000 Ohms. The conductance of the bottom block select transistor 65A is much better however, because it can be shared among neighboring bitlines.

The extra load on the contactless, virtual ground cells in the preferred memory array according to the present invention tends to decrease the programming speed, by reducing the voltage available to program the memory cell, and by reducing the efficiency of programming at high voltages. The programming performance of the memory cell is illustrated in FIG. 3, for a constant 12 volt gate-to-source voltage along trace 100, a constant 10 volt gate-to-source voltage along trace 101, and a two-step gate-to-source voltage along trace 102 according to the present invention. The waveform for the gate-to-source voltage in each of the three modes is illustrated in the lower section of FIG. 3. Thus, for the 12 volt only trace 100, the gate-to-source voltage is constant at 12 volts, as illustrated along trace 103. For the 10 volt only gate-to-source voltage trace 101, the gate-to-source voltage remains constant at 10 volts, as illustrated along trace 104. For the two-step programming technique of trace 102, the gate-to-source voltage steps as illustrated by the bold trace 105.

The upper graph in FIG. 3 shows threshold voltage VT achieved versus time of the programming interval. As can be seen, trace 100 eventually achieves a relatively high threshold voltage, but programs more slowly than the 10 volt only trace 101. The 10 volt only trace 101 does not achieve as high a final VT voltage, but the 10 volt only trace has a very rapid rise during the first portion of the programming phase and then begins to level off.

To take advantage of the very rapid rise of the 10 volt only trace 101, and the high threshold potential of the 12 volt only trace 100, a two-step programming potential, as illustrated by trace 105, can be applied according to the present invention. This results in a trace 102, which increases rapidly during the first 10 volt phase, and then continues to rapidly increase during the second 12 volt phase to the high programming potential that can be achieved with a 12 volt programming potential. Also, the time to achieve the high threshold voltage is significantly decreased using a programming potential which increases as a function of time during the programming interval.

One shot curves of FIGS. 4 and 5 provide some context for the need for the controlled programming potential according to the present invention in the contactless, virtual ground array. In particular, the prior art one shot curve for conventional NOR array cells is shown in FIG. 4. This curve is characterized by very steep load lines, generally 200, and relatively high DC programming current (more than 100 micro amps) during the segment, generally 201. Also, the cell programming begins at the knees, generally 202, in the curve. The distance between the knees 202, and the load lines 200 is relatively good. This provides good efficiency for the programming operation for the conventional FLASH EPROM cell.

In contrast, the one shot curves for the contactless, virtual ground cell is shown in FIG. 5. It includes a first trace 210 for a programming potential of 12 volts, and a second trace 211 for a programming potential of 10 volts to emulate an over-erased cell. Also, a load line 213 is illustrated which has a significant slope compared to the load line of FIG. 4. This slope is due to the increased resistance on the cells as described above.

The knee 212 on trace 210 for the 12 volt programming potential is quite close to the load line 213, indicating a lower drain overdrive voltage. This reduces the efficiency of the programming during initial phases, and increases the time required for programming. As can be seen, for the 10 volt programming potential along trace 211, the drain overdrive voltage represented by the distance between the knee 214 and the load line is significantly greater than for the 12 volt trace 210. Thus, the programming efficiency is increased.

Furthermore, the one shot plot in FIG. 5 illustrates that the DC programming current is quite low for the contactless, virtual ground cells according to the present invention. To take advantage of the low programming current, and the fact that the programming data is the same for all cells in a block during preprogramming, four cells are pre-programmed and verified in parallel for embedded erase operations as mentioned above. Also, since the programming speed is faster with a lower programming potential during the beginning of the interval due to more drain overdrive voltages assuming the same programming load line, the cells according to the present invention are programmed with a lower programming potential during the beginning of the programming interval. During the end of the programming interval, higher control gate voltage is used to achieve higher turn-on threshold VT.

As mentioned above, a further enhancement is provided by reducing the load on the bitlines during the pre-programming. The circuit for implementing the reduced load is illustrated in FIG. 6. In FIG. 6, the column select transistor 250 is coupled to a global bitline BL. The output of the column select transistor 250 is coupled to data line 251 which is connected to the sense amp circuitry 252, and to program data-in circuitry, generally 253. The program data-in circuitry 253 includes diode connected transistor 254 which is coupled between the $V_{PP}$ power supply and transistor 255. The gate of transistor 255 is supplied to a data-in selector 256. The data-in selector 256 is enabled when the selected bitline is to be programmed to a zero value. The selector has a first input at a pre-specified voltage V, and a second input at the pre-specified voltage V+0.5 volts. During the pre-programming, in which four cells are programmed in parallel, the control input 4× is energized to select the voltage V+0.5. Otherwise, the voltage V is applied, where V is about 8.5 volts for an embodiment using the architecture of FIG. 2. This has the effect of controlling the effective resistance of transistor 255, and the load on the selected bitline. The source of transistor 255 is coupled to the drain of transistor 256. The gate of transistor 256 is coupled to the reference voltage $V_{DD}$. The source of transistor 256 is coupled to the drain of transistor 257. The gate of transistor 257 is coupled to control signal RECOVER. The source of transistor 257 is coupled to ground. The RECOVER signal and transistor 257 are used for data line (251) discharge after programming.

By controlling the effective resistance of transistor 255, the slope of the load line, represented by trace 213 in FIG. 5, can be increased, thereby increasing the distance between the knee 214 and the load line in a given programming sequence, that is increasing the drain overdrive voltages.

FIG. 7 illustrates an architecture for a controllable voltage source according to the present invention. The voltage source receives a programming potential $V_{PP}$ (12V±0.5) on line 300 and a power supply potential $V_{DD}$ (5V±0.5) on line 301. A sequence of voltage dividers, including a program verify voltage source 302, an erase verify voltage source 303, a program high source voltage 304, a program medium voltage source 305, and a program low voltage source 306, are coupled between the $V_{PP}$ potential 300 and the output line 307 supplying the voltage AVX to the wordline drivers. In addition, a negative voltage generator (not shown), for use during an erase mode is coupled to the wordlines. A read voltage source 308 is coupled between the $V_{DD}$ line 301 and the AVX line 307. Control signals on line 309 control the voltage sources under control of the mode control circuit.

In the preferred system, in combination with the load line adjustment described with reference to FIG. 6, a three-step waveform is illustrated in FIG. 8 and implemented using a controllable voltage source such as shown in FIG. 7. The three-step interval includes a first subinterval, generally 320, for 5 microseconds at a voltage of approximately 7.5 volts. A second subinterval 321 is included in which the control voltage is stepped up to approximately 10 volts for 5 microseconds. Finally, a third subinterval, generally 322, is included in which the programming potential on the control gate is stepped up to approximately 12 volts for 15 additional microseconds. This achieves a high threshold voltage in a short pre-programming interval, for cells coupled to four wordlines in parallel.

Alternative waveforms in which the programming voltage is varied as a function of time during a programming interval are illustrated in FIG. 3, as described above, and in FIG. 9. In FIG. 9, a more continuous control function is implemented in which the voltage increases generally linearly from 7 volts to 12 volts during a first subinterval, generally 323, and is held at 12 volts constant during a second subinterval, generally 324.

An embedded sector erase operation using the programming techniques designed above is shown in FIGS. 10A and 10C, which provide a detailed flow chart for the embedded erase operation according to the present invention, with block level pre-programming, erasing, and verification. A detailed block diagram of a logic architecture for executing this algorithm is set out in our co-pending application entitled FLASH EPROM WITH BLOCK ERASE FLAGS FOR OVER-ERASE PROTECTION, filed on the same day as the present application and owned by the same Assignee.

The algorithm begins with a loop consisting of steps 600, 601, and 602 in FIG. 10A waiting for a command consisting of two 20 (hex) values on the input. Thus, the loop includes a reset step 600, which proceeds to a test for 20 (hex) (step 601). If the test fails, the algorithm loops back to the reset step 600. If the test is successful, then the algorithm tests for a D0(hex) in step 602. If the test for D0(hex) fails, then the algorithm loops back to the reset step 600. If a sequence of 20 (hex) followed by D0(hex) is detected at step 602, then the algorithm goes to step 603 to assert the LOAD signal. This results in setting one of 32 flags in response to a decode of the incoming address. At this point, a timer is enabled in step 604. Next, the algorithm tests for assertion of the PGRES signal, which indicates that the chip enable goes low during assertion of output enable to signal that the chip should latch another address and set another flag. If the signal is high, then the algorithm loops to step 606 to reset the RV timer, then a flag is set in response to the input address (step 607). At that point, the algorithm loops back to the step 604 to enable the RV timer.

If the PGRES signal is not high at step 605, then the algorithm tests for expiration of the RV timer (step 608). In the preferred system, this is about 100 microseconds. If the timer has not expired, then the algorithm loops to step 604. If the timer has expired, then the PGLOEND signal is asserted at step 609 indicating the ending of the sector address load sequence for latching the blocks to be erased. After step 609, the algorithm loops to FIG. 10B.

In FIG. 10B, the algorithm begins after the set PGLOEND signal in step 609 of FIG. 10A. The flag for block zero is ready for evaluation (step 610), and the PEVAL is set to indicate the pre-programming flag evaluation interval of the erase mode (step 611).

After the setting of PEVAL, the FLAGRESB signal is evaluated in step 612. If the signal is zero, then the algorithm determines whether the last block has been evaluated in step 613. If the last block has been evaluated, then the PEVAL signal is reset in step 614 and the ERS signal is set high in step 615. If at step 613, the last block had not been evaluated, then the MSB counter is incremented in step 654 and the algorithm loops back to step 611 to evaluate the balance of the blocks having set flags.

If at step 612, the FLAGRESB was not zero, indicating a set flag, then the algorithm loops to step 616. At step 616, the PGM signal is set high and the PEVAL signal is reset. This results in supplying the programming potentials to the bitlines, wordlines, and virtual ground terminals in the block to be erased. In one embodiment, four wordlines in respective sectors of the memory are enabled and parallel so that four bytes are pre-programmed in parallel.

After enabling the programming voltages as indicated by step 617, a timer PGMREC1 is enabled to wait for program voltage recovery (step 618). After step 618, program verify voltages are driven (step 619). A second verify timer is enabled for program verify voltage recovery in step 620.

After expiration of the timer in step 620, the logic determines whether the output of the comparator that tests the cells energized during step 619 is high (step 621). If it is high, then the algorithm tests whether Q13 is high in step 621, which indicates that the least significant address counter has overflowed. In an embodiment pre-programming 4 bytes in parallel, when the two least significant bits (Q12, Q13) are masked, the algorithm tests for Q11, which indicates counter overflow for 4 byte increments. If it has overflowed, then the algorithm determines whether the last block has been verified (step 623). If the last block has been verified, then PGM is reset in step 624 and the ERS signal is set high in step 625.

If at step 623, the last block had not been programmed, then the algorithm loops to step 614 to increment the MSB counter and proceed to the next block having a set flag.

If at step 622, the Q13 (or Q11) value had not overflowed, then the least significant bit counter is incremented by one (or by four when testing on Q11) and the PECNT signal is reset (step 626). Next, the algorithm loops to step 617 to continue programming the block. The PECNT signal is a retry counter which is incremented in the event the match signal at step 621 was not high. Thus, if after step 621 the match signal is not high, the algorithm tests whether the retry counter PECNT has overflowed (block 627).

If it had overflowed, then an error is indicated and the algorithm hangs up (step 628). If the counter has not overflowed then it is incremented in step 629 and the algorithm loops back to step 617.

As indicated with respect to FIG. 10B, when the last block has been successfully preprogrammed, the ERS signal is set high, either at step 615 or step 625. After the setting of ERS high, the algorithm loops to the procedure illustrated in FIG. 10C.

As shown in FIG. 10C, the first step is to set up the erase operation by applying the proper erase voltages to the blocks to be erased as controlled to the sources through the bottom block select transistor BBSEL and to wordlines in an array as shown in FIG. 2 (step 630). After the erase operation, an erase recovery timer is used to allow for recovery of the erase voltages (step 631). After recovery in step 631, the ERSVFY signal goes high and the chip enters an erase verify operation (step 632). Next, the delayed erase verify signal DEV goes high (step 633). At this point, the erase compare latch accepts data from an addressed cell (step 634). After that point, the algorithm tests for no match, a match and an overflow indicated by the signal Q13, or the FLAGRESB signal being low (step 635). If any one of these conditions is not met, indicating that a successful match on the byte has occurred, or the end of the block has not been reached, or there is a flag still yet to be reset, then the algorithm loops to step 636 where the LSB address is incremented. After step 636, the algorithm returns to step 634 to latch the data from the next byte.

If at step 635 the byte did not verify, or it verified and the address counter had overflowed, or the flag of the block under test, then the algorithm loops to step 637 where it tests for the successful match with overflow condition. If it is a successful match, then the flag is reset for the block (step 638). After resetting the flag, the algorithm loops back to step 639 where it tests whether the last block has been tested. Similarly, if at step 637 the reason for reaching step 637 was other than a successful match and overflow of the LSB counter, then the algorithm goes to step 639. At step 639, if the last block has not been tested, then the algorithm loops to step 640 where the block address is incremented and the LSB address is reset. From step 640, the algorithm loops to step 634 to begin testing the next block having a set flag.

If at step 639, the last block has been tested, then the algorithm goes to step 641 where the ERSVFY and DEV signals are reset, and a recovery timer is initiated. After expiration of the recovery timer, the ALFGRES signal is tested (step 642). If, in testing the ALSGRES signal, it is determined that all flags have been reset, then the erase operation is complete, and the control circuits reset (step 643). If all flags had not been reset, then the attempt counter PECNT is tested (step 644) to determine whether it has exceeded a selected value, such as 1,024 (8FF hex). If it has exceeded the selected value, then an error has occurred and the attempt is given up (step 645). If the counter in step 644 has not expired, then it is incremented in step 646 and the algorithm loops to step 630 to re-erase blocks that did not pass erase verify.

In sum, a circuit for speeding up the preprogramming speed during embedded erase operations for FLASH EPROMs is provided. The circuit is particularly useful in the contactless, virtual ground array architecture described above, or other architectures in which the load on the cells being programmed is relatively high.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. In a data storage device including a plurality of floating gate storage transistors having respective control gates, sources and drains, an apparatus for hot electron injecting a charge into a floating gate comprising:

a voltage source, coupled to the control gate, the source, and the drain of a selected floating gate storage transistor, to supply a gate programming potential to the control gate, a voltage to the source, and a voltage to the drain of the selected floating gate storage transistor to hot electron inject a charge into the floating gate; and a control circuit coupled to the voltage source for varying the gate programming potential during hot electron injection within a single pulse having a first interval and a second interval after the first interval, so that a first potential sufficient to induce hot electron injection is applied during the first interval of the single pulse and a second potential higher than the first potential is applied during the second interval of the single pulse; wherein the single pulse has a duration less than 2 microseconds.

2. The apparatus of claim 1, wherein the control circuit changes the gate programming potential from the first potential to the second potential relatively abruptly after the first interval.

3. The apparatus of claim 1, wherein the control circuit changes the gate programming potential from the first potential to the second potential relatively gradually after the first interval.

4. The apparatus of claim 1, wherein the voltage source includes a controllable voltage source applying a voltage to the control gate of the selected floating gate storage transistor, and the control circuit controls the gate programming potential by maintaining the voltage on the source of the selected floating gate storage transistor at a substantially constant programming voltage and controlling the controllable voltage source to vary the voltage applied to the control gate of the selected floating gate storage transistor.

5. The apparatus of claim 4, wherein the voltage source applies substantially a ground potential to the sources of the floating gate storage transistors during programming.

6. The apparatus of claim 1, wherein the data storage device includes a data line coupled to the drains of a subset of the plurality of floating gate storage transistors, and further includes a circuit coupled with the data line to reduce load resistance of the data line during programming.

7. A data storage device comprising:

a plurality of floating gate storage transistors, the plurality of floating gate storage transistors including at least a floating gate storage transistor having a control gate, a channel, a floating gate that extends the length of the channel, a source, and a drain;

a voltage source, coupled to the control gate, the source, and the drain of the floating gate storage transistor, to supply a gate programming potential to the control gate, a voltage to the source, and a voltage to the drain of the floating gate storage transistor to hot electron inject a charge into the floating gate; and a control circuit coupled to the voltage source for varying the gate programming potential during hot electron injection within a single pulse having a first interval and a second interval after the first interval, so that a first potential sufficient to induce hot electron injection is applied during the first interval of the single pulse and a second potential higher than the first potential is applied during the second interval of the single pulse.

8. The data storage device of claim 7, wherein the drain of the floating gate storage transistor is connected across a load to a data-in circuit, the floating gate storage transistor has a characteristic drain to source voltage above which undesirable current flows through the floating gate storage transistor for a voltage applied to the control gate above a threshold near ground or lower, and wherein the control circuit causes a drain voltage potential less than the characteristic drain to source voltage to be applied across the data-in circuit and the source so that a load line is established preventing said undesirable current flow.

9. The data storage device of claim 7, wherein the drain of the floating gate storage transistor is connected across a load to a data-in circuit, and wherein the control circuit causes a drain voltage potential less than 9 volts to be applied across the data-in circuit and the source.

10. The data storage device of claim 7, wherein the control circuit changes the gate programming potential from the first potential to the second potential relatively abruptly after the first interval.

11. The data storage device of claim 7, wherein the control circuit changes the gate programming potential from the first potential to the second potential relatively gradually after the first interval.

12. The data storage device of claim 7, wherein the voltage source includes a controllable voltage source applying a voltage to the control gate of the floating gate storage transistor, and the control circuit controls the gate programming potential by maintaining the voltage on the source of the floating gate storage transistor at a substantially constant programming voltage and controlling the controllable voltage source to vary the voltage applied to the control gate of the floating gate storage transistor.

13. The data storage device of claim 7, wherein the voltage source applies substantially a ground potential to the sources of the floating gate storage transistors during programming.

14. The data storage device of claim 7, wherein the data storage device includes a data line coupled to the drains of a subset of the plurality of floating gate storage transistors, and further includes a circuit coupled with the data line to reduce load resistance of the data line during programming.

* * * * *